United States Patent
Gurski et al.

(10) Patent No.: US 8,989,061 B2
(45) Date of Patent: Mar. 24, 2015

(54) METHODS AND APPARATUS FOR INITIAL ACQUISITION IN A COMMUNICATION SYSTEM

(75) Inventors: Remi J. Gurski, San Diego, CA (US); Matthias Brehler, San Diego, CA (US); Raghu N. Challa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 951 days.

(21) Appl. No.: 12/796,009

(22) Filed: Jun. 8, 2010

(65) Prior Publication Data
US 2010/0322117 A1 Dec. 23, 2010

Related U.S. Application Data

(60) Provisional application No. 61/187,566, filed on Jun. 16, 2009.

(51) Int. Cl.
H04J 3/00 (2006.01)
H03G 3/30 (2006.01)
H04B 1/7073 (2011.01)
H04B 1/708 (2011.01)

(52) U.S. Cl.
CPC ........... *H03G 3/3078* (2013.01); *H03G 3/3042* (2013.01); *H03G 3/3052* (2013.01); *H04B 1/70735* (2013.01); *H04B 1/708* (2013.01)
USPC ....................... 370/280; 455/552.1

(58) Field of Classification Search
None
See application file for complete search history.

(56) References Cited

U.S. PATENT DOCUMENTS

| 3,657,547 | A  | * | 4/1972 | Mansfield .................. 250/208.3 |
| 7,773,702 | B2 |   | 8/2010 | Xiong |
| 2005/0254442 | A1 | * | 11/2005 | Proctor et al. ................ 370/294 |
| 2007/0189229 | A1 |   | 8/2007 | Li et al. |
| 2008/0081573 | A1 | * | 4/2008 | Hwang ......................... 455/136 |
| 2008/0261650 | A1 | * | 10/2008 | Piriyapoksombut et al. .......................... 455/552.1 |
| 2009/0149139 | A1 | * | 6/2009 | Harel et al. ................... 455/101 |

FOREIGN PATENT DOCUMENTS

CN 101159439 A 4/2008

(Continued)

OTHER PUBLICATIONS

WO 2004/073321 A1, Title: Initial Cell Search in Wireless Communicatio Systems, Inventor: Demir et al., Date: Aug. 26, 2004, Applicant: Inter-Digital Technology Corporation.*

(Continued)

*Primary Examiner* — Andrew Lai
*Assistant Examiner* — Leon Andrews
(74) *Attorney, Agent, or Firm* — Stanton Braden

(57) ABSTRACT

A plurality of predetermined amplifier gain states for a low noise amplifier (LNA) are run during initial acquisition in a time division duplex (TDD) system. Acquisition of a received signal is determined based on searching across the plurality of predetermined amplifier gain states. Forcing the amplifier gain into a set of predetermined gain states affords quicker resolution of initial acquisition for setting the gain of the LNA, which in TDD systems is complicated due to an uncertain uplink/downlink timeline that precludes continuous operation of a gain setting algorithm run in the LNA.

40 Claims, 5 Drawing Sheets

(56) References Cited

FOREIGN PATENT DOCUMENTS

| | | |
|---|---|---|
| EP | 1653751 A1 | 5/2006 |
| JP | 08056132 | 2/1996 |
| JP | 2003046353 A | 2/2003 |
| JP | 2005176080 A | 6/2005 |
| JP | 2005278017 A | 10/2005 |
| JP | 2006020062 A | 1/2006 |
| JP | 2007501547 A | 1/2007 |
| WO | WO2004073321 A2 * | 8/2004 |
| WO | WO-2005015920 A1 | 2/2005 |
| WO | WO-2005109632 | 11/2005 |

OTHER PUBLICATIONS

WO 2004073321 A2: Author: Demir et al., Title: Digital Cell Search in Wireless Communications Systems, Date: Aug. 26, 2004, Applicant: Inter-Digital Technology Corporation.*

International Search Report and Written Opinion—PCT/US2010/038823, International Search Authority—European Patent Office—Dec. 16, 2010.

Yoonoh Yang, et al., "On the performance of acquisition using antenna array in the DS-SS system" [Online] Sep. 8, 1999-Sep. 11, 1999 pp. 1-10, XP002610878.

Taiwan Search Report—TW099119525—TIPO—Jun. 17, 2013.

* cited by examiner

METHODS AND APPARATUS FOR INITIAL ACQUISITION IN A COMMUNICATION SYSTEM

CLAIM OF PRIORITY UNDER 35 U.S.C. §119

The present application for patent claims priority to Provisional Application No. 61/187,566 entitled "Methods and Apparatus for Initial Acquisition in a Communication System" filed Jun. 16, 2009, and assigned to the assignee hereof and hereby expressly incorporated by reference herein.

BACKGROUND

1. Field

The present disclosure relates generally methods and apparatus for initial acquisition in a communication system, and more specifically to setting a low noise amplifier (LNA) during initial acquisition by a transceiver in Time Division Duplex (TDD) systems.

2. Background

In communication systems it is known to employ duplexing for two way communications. In particular duplexing refers to the way downlink (DL) or forward link data and uplink (UL) or reverse link data is arranged in two-way transmissions. In the example of a wireless communication system, the downlink (DL) carries information from a Base Station (BS or eNodeB) or Access Point (AP) to mobile devices such as User Equipment (UE) or Access Terminal (AT). The uplink (UL) carries information from a UE or AT to a BS or AE. There are two types of well known duplexing schemes; Frequency Division Duplex (FDD) and Time Division Duplex (TDD).

In FDD, downlink (DL) data and uplink (UL) data are generally separated or differentiated by using two distinct channels for transmitting a downlink sub-frame and an uplink sub-frame at the same time slot. FDD, however, is inefficient for handling asymmetric data services since data traffic may only occupy a small portion of a channel bandwidth at any given time. Therefore TDD (Time Division Duplex) is used in such systems offering such services (e.g., Long Term Evolution (LTE) or WIMAX (IEEE 802.16)) because a TDD scheme uses only one channel for transmitting downlink and uplink sub-frames at two distinct time slots. Thus, TDD affords higher spectral efficiency than FDD, and allows more flexibility in handing symmetric and asymmetric broadband traffic. Furthermore TDD systems by using half the bandwidth are, in general, less complex and thus cheaper over FDD especially for asymmetric data services, such as those offered in LTE or WiMax.

The initial acquisition of a TDD wireless system (such as LTE-TDD and WIMAX-TDD), however, can be more complicated than FDD. This is due to the fact that a receiver (either in a base station or a mobile device) cannot run an Automatic Gain Control/Low Noise Amplifier (AGC/LNA) algorithm in a continuous mode (as is possible in FDD system) because of the uncertainty of UL/DL timeline due to the use of a single frequency band. The LNA cannot be changed in a closed loop fashion as the AGC does not know if the Receiver (Rx) samples are coming from a DL or a UL, which can have wide dynamic range of 100 dB between the UL and the DL. Accordingly, there is a need for quicker and more accurate initial acquisition in a TDD system.

SUMMARY

According to an aspect, a method for initial acquisition in a communication system is disclosed. In particular, the method includes running a plurality of predetermined amplifier gain states for at least one amplifier in a predefined order during initial acquisition in a time division duplex (TDD) system. After the gain statues are run, the method then includes determining initial acquisition from received signals based on searching across the plurality of predetermined amplifier gain states run in the predefined order until a known signal is detected.

According to another aspect, an apparatus for use in a communication device in disclosed. The apparatus includes a searcher configured to run a plurality of predetermined amplifier gain states for at least one amplifier in a predefined order during initial acquisition in a time division duplex (TDD) system. The apparatus also includes an initial acquisition unit configured to determine initial acquisition from received signals based on searching across the plurality of predetermined amplifier gain states run in the predefined order until a known signal is detected.

According to still another aspect, an apparatus for use in a communication device to perform initial acquisition is disclosed. The apparatus includes at least one processor configured to run a plurality of predetermined amplifier gain states for at least one amplifier in a predefined order during initial acquisition in a time division duplex (TDD) system. The processor is also configured to determine initial acquisition from received signals based on searching across the plurality of predetermined amplifier gain states run in the predefined order until a known signal is detected.

According to yet another aspect, an apparatus for use in a communication device is disclosed. The apparatus features means for running a plurality of predetermined amplifier gain states for at least one amplifier in a predefined order during initial acquisition in a time division duplex (TDD) system. Means for determining initial acquisition from received signals based on searching across the plurality of predetermined amplifier gain states run in the predefined order until a known signal is detected are also part of the apparatus.

According to still one more aspect, a computer program product, comprising a computer-readable medium comprising is disclosed. The medium includes code for causing a computer to run a plurality of predetermined amplifier gain states for at least one amplifier in a predefined order during initial acquisition in a time division duplex (TDD) system. The medium also includes code for causing a computer to determine initial acquisition from received signals based on searching across the plurality of predetermined amplifier gain states run in the predefined order until a known signal is detected.

DETAILED DESCRIPTION

The present disclosure features methods and apparatus that afford quicker and more accurate timing acquisition in a TDD system. In particular, the present disclosure includes solutions to the ambiguity of where to set the gain of a low noise amplifier (LNA) in a receiver: One disclosed methodology is to select a set of possible LNA states, force the LNA into one of these states, run the acquisition algorithm, and then scan across the set of LNA states until acquisition is successful. This methodology may be sped up based upon the recognition that a searcher algorithm needs a very small signal-to-noise ratio (SNR) and the typical LNA states have considerable overlap in usable dynamic range. Accordingly, a sparse subset of all possible LNA states may be chosen to speed up the acquisition. Initial acquisition can be sped up further by using multiple antennas and corresponding receiver engines set to different gain states to work in parallel to derive energy metrics for the respective different LNA gain states.

The techniques described herein may be used for various wireless communication networks such as Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), cdma2000, etc. UTRA includes Wideband-CDMA (W-CDMA) and Low Chip Rate (LCR). cdma2000 covers IS-2000, IS-95 and IS-856 standards. A TDMA network may implement a radio technology such as Global System for Mobile Communications (GSM). An OFDMA network may implement a radio technology such as Ultra Mobile Bandwidth (UMB), Evolved UTRA (E-UTRA), IEEE 802.11, IEEE 802.16 (WiMax), IEEE 802.20, Flash-OFDM, etc. UTRA, E-UTRA, and GSM are part of Universal Mobile Telecommunication System (UMTS). Long Term Evolution (LTE) is an upcoming release of UMTS that uses E-UTRA. UTRA, E-UTRA, GSM, UMTS and LTE are described in documents from an organization named "3rd Generation Partnership Project" (3GPP). cdma2000 is described in documents from an organization named "3rd Generation Partnership Project 2" (3GPP2). These various radio technologies and standards are known in the art. For clarity, certain aspects of the techniques are described below for UMB, and UMB terminology is used in much of the description below.

Although the presently disclosed method and apparatus are described for use in LTE or WiMax systems, the disclosed concepts apply to other communication systems which utilize TDD. Furthermore, as discussed above the presently disclosure need not be limited to OFDM-based systems.

Figure 1:
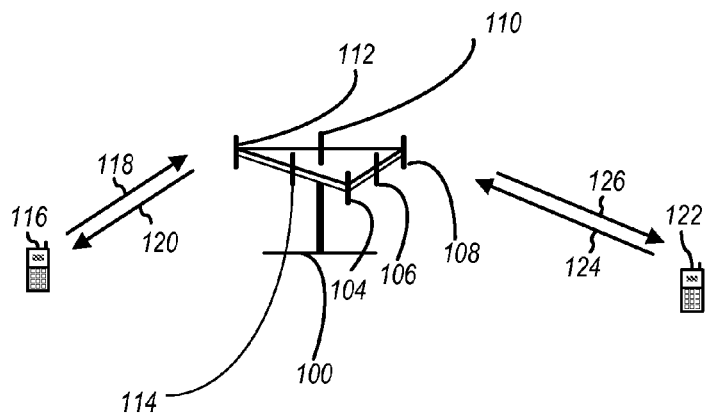
FIG. 1 illustrates an example of a multiple access wireless communication system.

Referring to FIG. 1, an example of a multiple access wireless communication system in which the present methods and apparatus may be employed is shown. An access point 100 (AP) (or eNodeB or base station) includes multiple antenna groups, one including 104 and 106, another including 108 and 110, and an additional including 112 and 114. In FIG. 1, only two antennas are shown for each antenna group, however, more or fewer antennas may be utilized for each antenna group. Access terminal 116 (AT) (or mobile device or user equipment (UE)) is in communication with antennas 112 and 114, where antennas 112 and 114 transmit information to access terminal 116 over a downlink (DL) or forward link 120 and receive information from access terminal 116 over an uplink (UL) or reverse link 118. Access terminal 122 is in communication with antennas 106 and 108, where antennas 106 and 108 transmit information to access terminal 122 over forward link 126 and receive information from access terminal 122 over reverse link 124. In an FDD system, communication links 118, 120, 124 and 126 may use different frequency for communication. For example, DL 120 may use a different frequency then that used by UL 118. In a TDD system, a single frequency is used for both UL 118 and DL 120, with time multiplexing of UL and DL signals.

Each group of antennas and/or the area in which they are designed to communicate is often referred to as a sector of the access point. In an aspect, antenna groups each are designed to communicate to access terminals in a sector of the areas covered by access point 100.

An access point may be a fixed station used for communicating with the terminals and may also be referred to as an access point, a Node B, or some other terminology. An access terminal may also be called an access terminal, user equipment (UE), a wireless communication device, terminal, access terminal or some other terminology.

Figure 2:
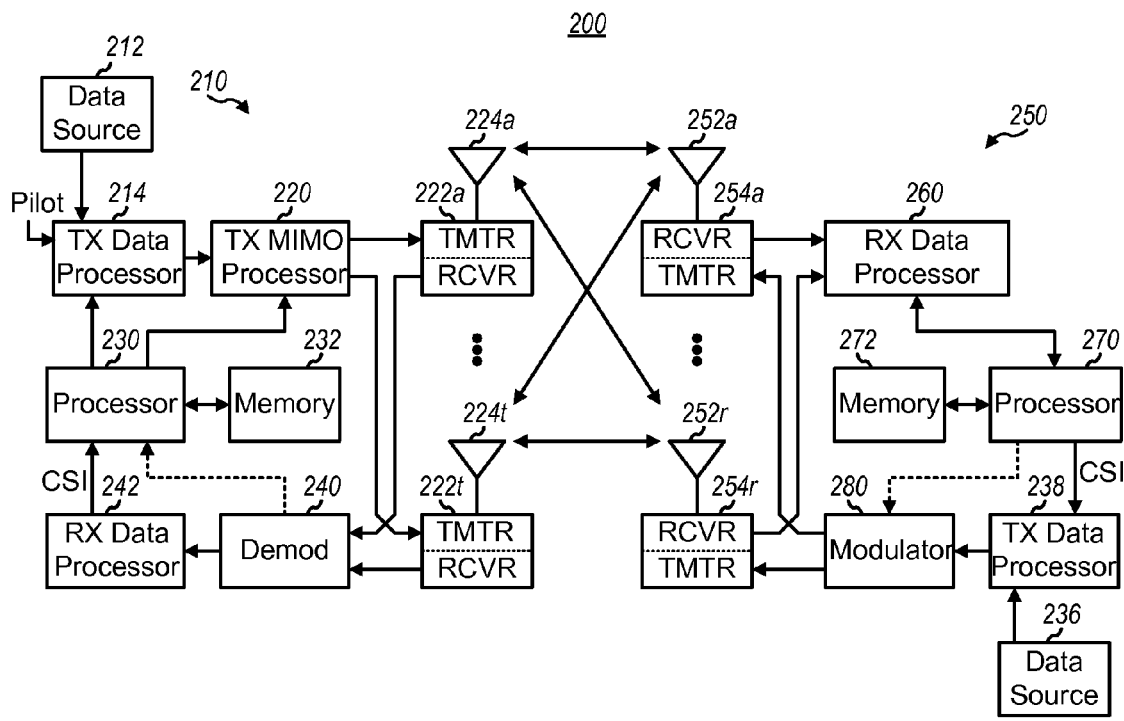
FIG. 2 is a block diagram of an exemplary communication system employing the presently disclosed methods and apparatus.

FIG. 2 is a block diagram of an example of a transmitter system 210 (also known as the access point) and a receiver system 250 (also known as access terminal) in a MIMO system 200 that provides spatial diversity multiplexing. At the transmitter system 210, traffic data for a number of data streams is provided from a data source 212 to a transmit (TX) data processor 214.

In an aspect, each data stream is transmitted over a respective transmit antenna. TX data processor 214 formats, codes, and interleaves the traffic data for each data stream based on a particular coding scheme selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (i.e., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230.

The modulation symbols for all data streams are then provided to a TX MIMO processor 220, which may further process the modulation symbols (e.g., for OFDM). TX MIMO processor 220 then provides NT modulation symbol streams to NT transmitters (TMTR) 222a through 222t. In certain aspects, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals are received by NR antennas 252a through 252r and the received signal from each antenna 252 is provided to a respective receiver (RCVR) 254a through 254r. Each receiver 254 conditions (e.g., filters, amplifies, and downconverts) a respective received signal, digitizes the conditioned signal to provide samples, and further processes the samples to provide a corresponding "received" symbol stream.

An RX data processor 260 then receives and processes the NR received symbol streams from NR receivers 254 based on a particular receiver processing technique to provide NT "detected" symbol streams. The RX data processor 260 then demodulates, deinterleaves, and decodes each detected symbol stream to recover the traffic data for the data stream. The processing by RX data processor 260 is complementary to that performed by TX MIMO processor 220 and TX data processor 214 at transmitter system 210.

The reverse link or UL message may comprise various types of information regarding the communication link and/ or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link or UL message transmitted by the receiver system 250. Processor 230 then determines which pre-coding matrix to use for determining the beamforming weights then processes the extracted message.

Figure 3:
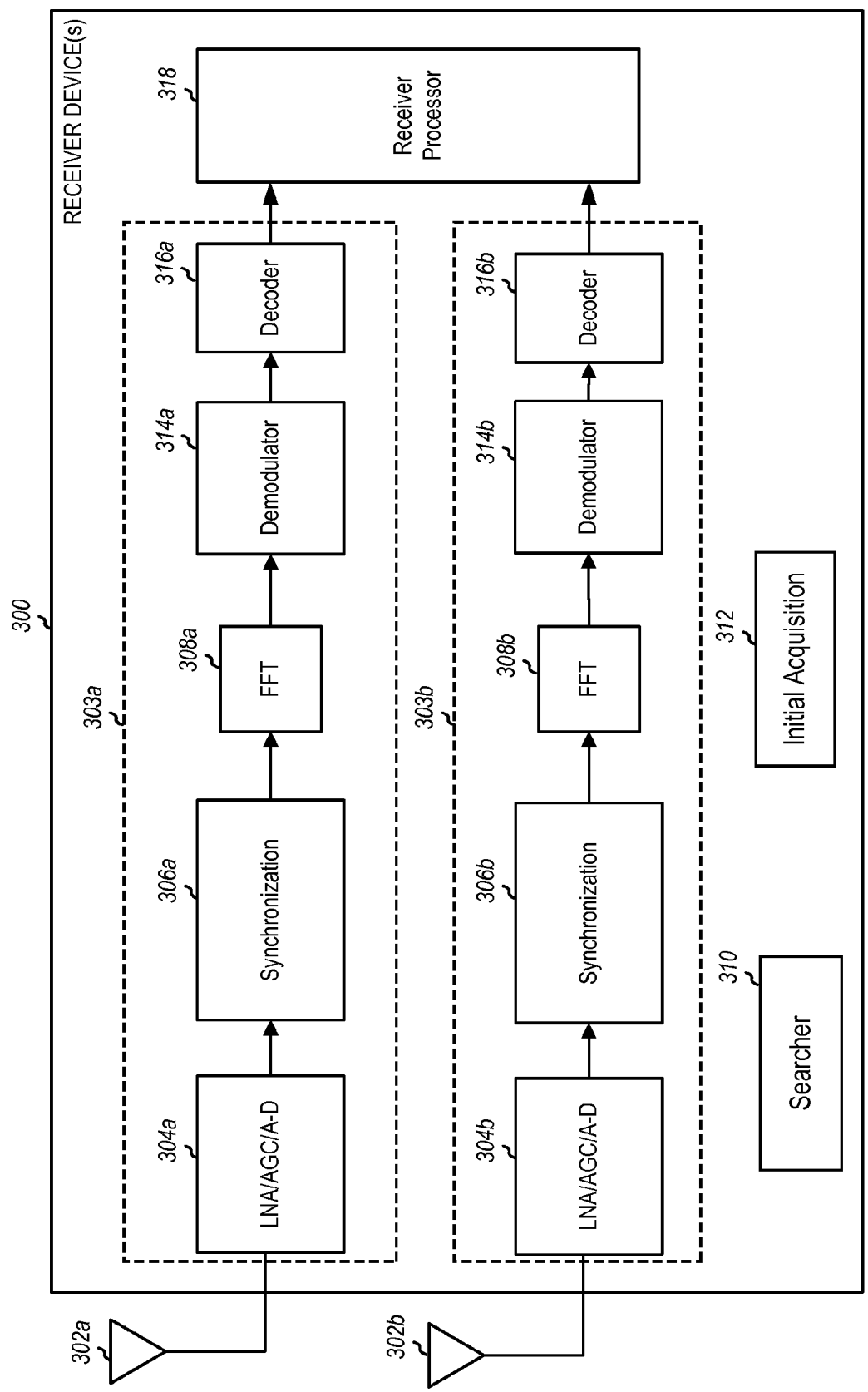
FIG. 3 is a block diagram of receiver portions of a communication device utilizing the present methods and apparatus.

It is noted that the present disclosure resolves the ambiguity of where to set the gain of LNA in a receiver, such as receivers 254 in FIG. 2, during initial acquisition: As one example of an implementation of such receivers, FIG. 3 illustrates a block diagram of receiver apparatus for a multiple antenna system. Although illustrated for a multiple antenna system, one skilled in the art will appreciate that the present disclosure is also applicable to a single antenna device as well.

As illustrated, the receiver(s) 300 include antennas 302a, 302b to receive transmitted wireless signals. The antennas 302a, 302b delivers the signal to respective receivers or receive engines 303a and 303b. Each of the receivers 303a, 303b include a respective block 304a, 304b representing a low noise amplifier (LNA) for amplifying the signal from antenna 302, an Automatic Gain Control (AGC) that works in conjunction with the LNA, and an analog-to-digital (A-D) converter that converts the analog wireless signal to a digital signal. It is noted that the presently disclosed methods and apparatus are particularly applicable to this block 304 as initial acquisition of the signal involves searching for the correct gain setting for the LNA that is neither saturated nor truncated such that the desired signal cannot be distinguished or acquired in a TDD system.

Each receiver 303 also includes a synchronization block 306 or equivalent unit to establish a timing window for sampling the subcarriers within the digital signal from blocks 304 with the correct synchronization or timing. The output of the synchronizer 306, which is a synchronized digital signal, is input to a Fast Fourier Transform (FFT) 308 for transformation of the signal from frequency domain to time domain.

For illustration purposes, a separate searcher unit 310 and an initial acquisition unit 312 are illustrated. These units perform a search process to search for a pilot for initial acquisition by forcing the LNA in blocks 304 to a set or plurality of possible gain states and then searching across the set unit acquisition is successful as determined by unit 312. It is noted that units 310 and 312, although shown as separate units, may be incorporated as part of block 304 (as well as part of synchronizer 306). It is further noted that the search algorithm effected, whether by separate units 310, 312, or incorporated as part of units 304 or 306, may further include the use of normalized noise metrics that normalize the power differences between gain hypotheses used in the LNA 304. Furthermore, units or modules 310 and 312 may be implemented through the use of one or more processors configured to run code to perform the functions of these modules.

In the illustrated example of FIG. 3, the time domain signal output from the FFT 308 may be input to a channel estimator (not shown) for channel estimation of the channel. As further shown in FIG. 3, the FFT 308 sends a time domain signal to a demodulator 314, which utilizes the channel estimation scheme determined by channel estimator to properly demodulate the time domain signal. The demodulator 314, in turn, delivers the demodulated signals to a decoder 316. Decoder 316 decodes the information and outputs the resultant bit stream for use by the mobile communication device in which the transceiver is housed, such as a mobile phone device, access terminal, or user equipment, as examples.

Figure 4:
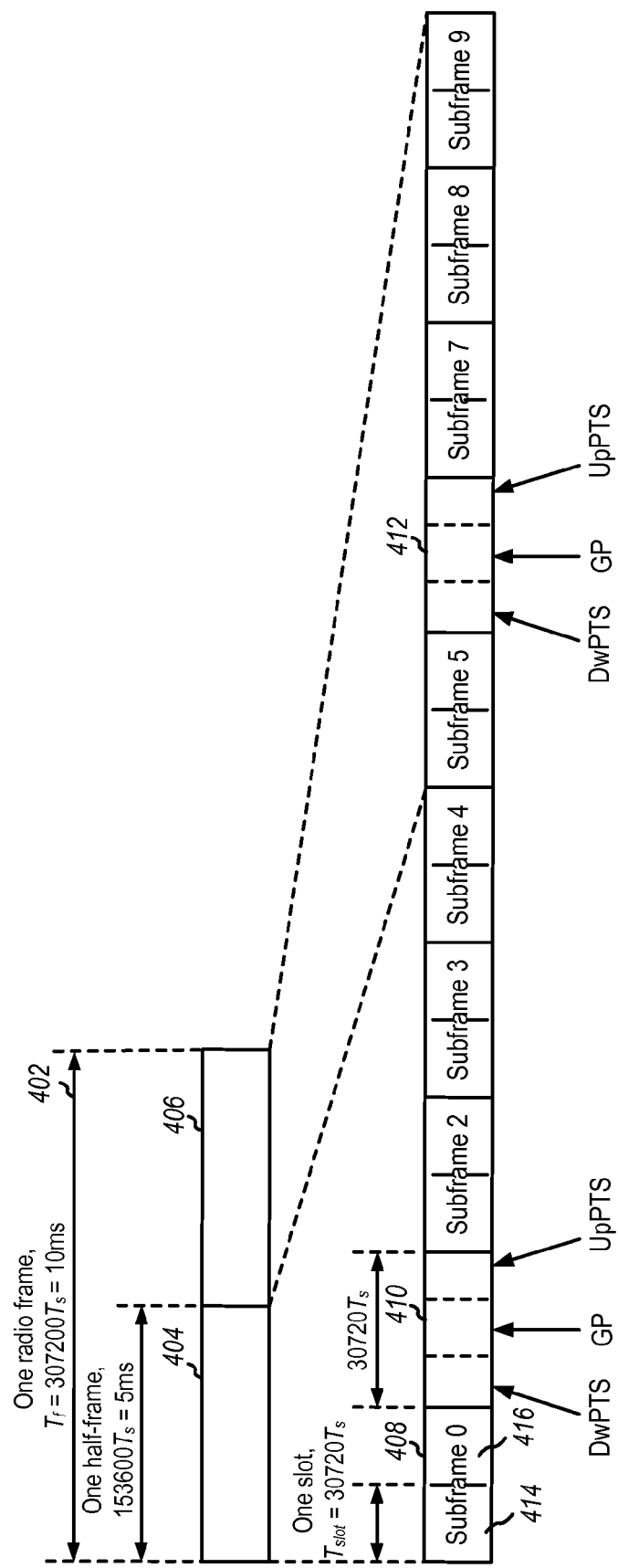
FIG. 4 is an illustration of Type 2 frame structure for TDD in LTE systems.

FIG. 4 illustrates a frame structure type 2 for LTE, in particular, which is a TDD frame structure. It is noted here that although the exemplary frame structure in FIG. 4 is particular to LTE, one skilled in the art will appreciate that the disclosed method and apparatus may be broadly applied to other types of TDD systems (and corresponding frame structures).

As may be seen in FIG. 4, each radio frame 402 of length $T_f = 307200T_s = 10$ ms consists of two half-frames 404, 406 of length $153600T_s = 5$ ms each. Each half-frame consists of five slots or subframes of length $30720T_s$ (e.g., Subframes 0 through 5). In the example shown in FIG. 4, since the half from is 5 ms long, each subframe has a duration of 1 ms.

Particular subframes include three special fields, a Downlink Pilot Time Slot (DwPTS), a Guard Period (GP), and an Uplink Pilot Time Slot (UpPTS) as illustrated specifically for Subframe 1 denoted by reference 410. Subframe 1 (410) in all configurations and Subframe 6 (412) in configurations 0, 1, 2 and 6 in Table 1 below consist of DwPTS, GP and UpPTS fields. These particular special subframes (denoted by "S") are used to support downlink (DL) to uplink (UL) switching. All other subframes are defined as two slots where a subframe i consists of slots 2i and 2i+1. These two slots are illustrated, for example, by a slots 414 and 416 in Subframe 0 (408) as one example.

TABLE 1

| Configuration | Switch-point periodicity | Subframe number | | | | | | | | | |
|---|---|---|---|---|---|---|---|---|---|---|---|
| | | 0 | 1 | 2 | 3 | 4 | 5 | 6 | 7 | 8 | 9 |
| 0 | 5 ms | D | S | U | U | U | D | S | U | U | U |
| 1 | 5 ms | D | S | U | U | D | D | S | U | U | D |
| 2 | 5 ms | D | S | U | D | D | D | S | U | D | D |
| 3 | 10 ms | D | S | U | U | U | D | D | D | D | D |
| 4 | 10 ms | D | S | U | U | D | D | D | D | D | D |
| 5 | 10 ms | D | S | U | D | D | D | D | D | D | D |
| 6 | 5 ms | D | S | U | U | U | D | S | U | U | D |

In an aspect, subframes 0 and 5 and DwPTS are always reserved for downlink transmission. The supported uplink-downlink allocations are listed in Table 1 where, for each subframe in a radio frame, "D" denotes the subframe is reserved for downlink transmissions, "U" denotes the subframe is reserved for uplink transmissions, and "S" denotes a special subframe with the three fields DwPTS, GP and UpPTS. Both 5 ms and 10 ms switch-point periodicity is supported. In the case of 5 ms switch-point periodicity, for example, UpPTS and subframes 2 and 7 are reserved for uplink transmission. In the case of 10 ms switch-point periodicity, DwPTS exist in both half-frames while GP and UpPTS only exist in the first half-frame and DwPTS in the second half-frame has a length equal to $30720T_s = 1$ ms. UpPTS and subframe 2 are reserved for uplink transmission and subframes 7 to 9 are reserved for downlink transmission One possible method for initial acquisition and the attendant finding of the correct LNA setting is to select a set of possible LNA states, and then force the LNA into one of these states. The acquisition algorithm is run for each state, and the searcher algorithm configured to scan across the set of LNA states until acquisition is successful. As one example, six (6) LNA states may be predetermined. The searcher then proceeds to force the LNA sequentially into each state until signal acquisition is successful. It is noted, however, that each LNA state may require approximately 10-20 ms to try to find a pilot (i.e., find the pilot for acquisition). In the case where the last LNA state of six states is successful, a sequential LNA state algorithm could push the time frame of acquisition up to 120 ms in this worst case.

Accordingly, it is further proposed that the above methodology may be sped up based on the recognition that a searcher algorithm needs a very small signal-to-noise ratio (SNR) and the typical LNA states have considerable overlap in usable dynamic range. Thus, a sparse subset of all potential or predetermined LNA states may be chosen to speed up the acquisition.

In TDD mode, prior to initial acquisition, uplink (UL) and downlink (DL) subframe boundaries (see e.g., FIG. 4) are unknown. Therefore, according to another aspect the initial acquisition or timing detection algorithms need to account for the possibly large power difference between UL and DL transmissions (e.g., 100 dB), which could result in false alarms or misdetections.

In still another aspect, it is possible to speed up acquisition by a power of two (2) by utilizing both antennas (and corresponding LNAs) to determine acquisition with only a slight loss in performance. Taking the example of FIG. 3, the LNA 304 in receiver 303a may be forced to one of the predetermined LNA gain states, whereas the LNA 304 in receiver 303b may be simultaneously forced to another one of the predetermined LNA gain states. Moreover, the energy metrics from each LNA can be arithmetically combined in a point by point manner. In this instance, if the LNA is in the wrong state with respect to the input power, the loss of performance is minimal and not detrimental. Additionally, if the LNAs are in the wrong state, a next LNA gain state for each LNA 304 of receivers 303a, 303b are set and searching resumes until the signal is found.

In one aspect the first and second gain states for receivers 303a, 303b may the lowest and highest states respectively, and the third and fourth LNA gain states are an increase and/or decrease in a convergent manner where the LNA gain states for each antenna approach each other. Alternatively, in an example with five (5) gain states, gain states 2 and 4 could be first tried, and if unsuccessful, then gain states 3 and 5 tried. One skilled in the art will appreciate that any number of various schemes for selection gain states may be used where LNA gain hypotheses of two or more antennas are tested simultaneously to effect speeding up of the acquisition process.

Although illustrated in terms of a multiple antenna system, the presently disclosed methods and apparatus may be implemented in a single antenna system. In such a case, an LNA may be placed in gain states that are varied across multiple bursts, with multiple time accumulations that still effect an increase in the acquisition speed. Thus, either spatial accumulations (e.g., multiple antennas) or time accumulations (e.g., a single antenna) are contemplated. In a particular aspect of time accumulation, the present methods and apparatus may be configured to change the LNA gain state across multiple looks at the pilot during a same initial acquisition. As an example of an implementation, the apparatus 300 would include only a single antenna (e.g., 302a) and receiver (e.g., 303a), wherein the searcher unit 310 and initial acquisition unit 312 are configured of run temporally run through gain states of LNA 304a during a same initial acquisition period.

Figure 5:
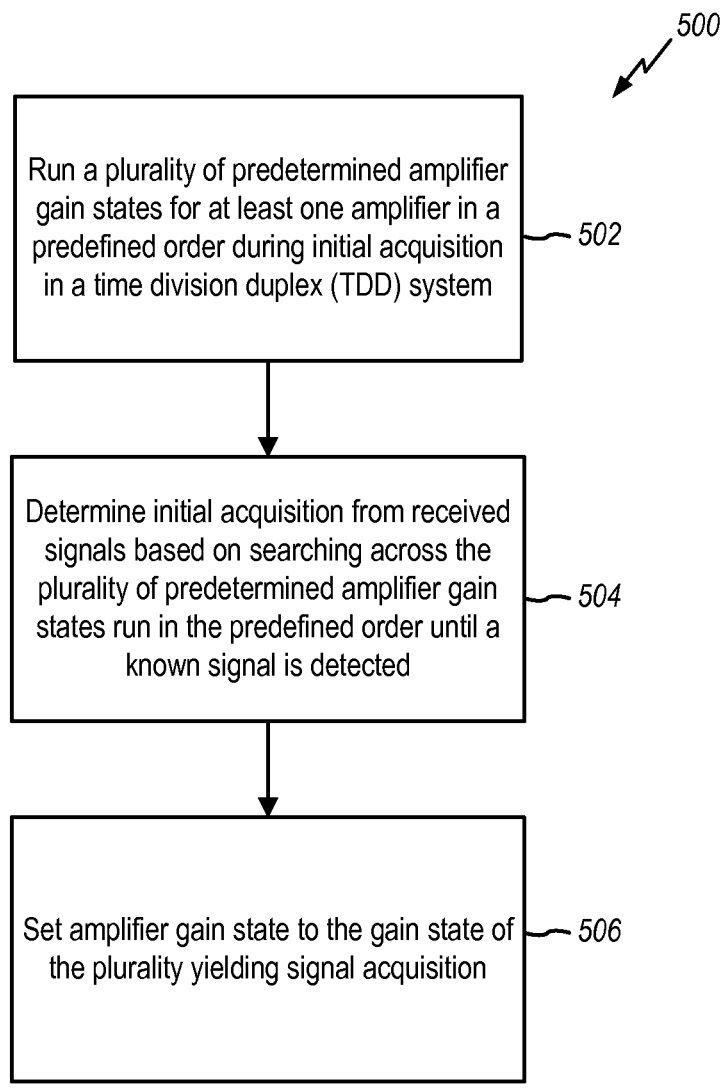
FIG. 5 is a flow diagram of an exemplary method for initial acquisition in a TDD system.

FIG. 5 illustrates a method 500 for initial acquisition in a communication system, such as LTE systems as one example. The method first includes block 502 including a process of running a plurality of predetermined amplifier gain states for an amplifier in a predefined order during initial acquisition in a time division duplex (TDD) system. Running the predetermined amplifier gain states involves forcing the LNA (e.g., LNA 304) into one of the states and running an initial acquisition algorithm, such as with an initial acquisition unit (e., 316) or some other suitable hardware, software, firmware, or any combination thereof.

Flow then proceeds to block 504 where a process of determining acquisition of a received signal based on searching across the plurality of predetermined amplifier gain states is effected. The searching processes and functions performed in block 504 may be implemented by a searcher unit such as unit 318 in FIG. 3, or any other suitable hardware, software, firmware, or any combination thereof.

It is noted here that although the processes of blocks 502 and 504 are illustrated as sequential, in an aspect the process of block 502 may be run concurrent with the process of block 504 until acquisition is determined. That is, the LNA is forced into a first gain state by process 502 and the searching or scanning function then determines if a match is found in process 504. If a match is found, no further searching would need be performed, whereas if a match is not found the LNA is forced into a next gain state by repeating the process of block 502 and a determination is made whether that gain state yields a match by the process of block 504, and so forth through all the plurality of gain states until a match is found. Thus, the processes of blocks 502 and 504 would be repeated for each gain state (or multiple gain states) of the plurality of predetermined gain states. After a match for initial acquisition is found, the method 500 also includes block 506 further comprising setting a gain of the amplifier to the gain state of the plurality yielding signal acquisition.

As mentioned before, in an aspect the plurality of predetermined amplifier gain states used in block 502 may consist of a sparse subset of a larger set of one of possible or predetermined amplifier gain states. This affords even greater faster acquisition of a pilot.

Figure 6:
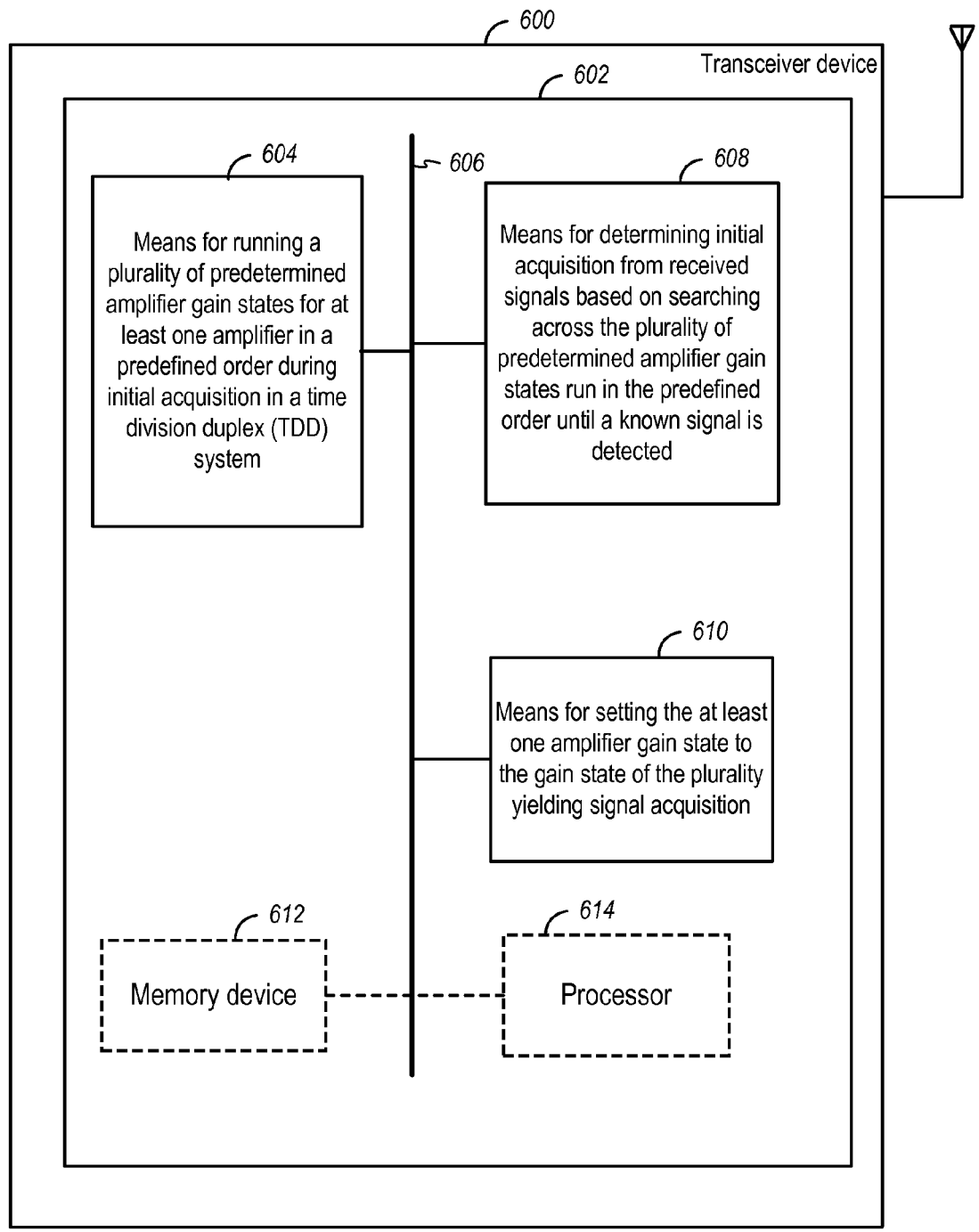
FIG. 6 is a block diagram of another apparatus for initial acquisition in a transceiver operable in a TDD system.

Another method for speeding up initial acquisition is the use of multiple antennas and respective receivers (e.g., 302 and 303). In this alternative, a first gain state of the plurality is run for a first received signal via a first antenna (e.g., 302a) simultaneously with at least a second gain state of the plurality run for a second received signal via a second antenna (e.g., 302b). If the first and second simultaneously run gain states do not yield the pilot for initial acquisition, the methodology would dictate trying two next gain states (i.e., third and fourth gain states run on signals from the first and second antennas), and so forth until acquisition is determined. In yet another aspect of this methodology, the first and second gain states could respectively be the lowest and highest gain states (i.e., the lower and upper limits) from among the plurality of predetermined gain states. If acquisition is not successful with either of these states, then the next third and fourth gain states may be incrementally a respective increased and decreased gain state from the gain state limits such that the next selected gain states are converged toward the median gain state(s) up until the initial acquisition is determined FIG. 6 illustrates another apparatus for initial acquisition in a transceiver operable in a TDD system. As illustrated, the apparatus 602 may be employed in a transceiver device 600, as one example. The apparatus 602 includes means 604 for running a plurality of predetermined amplifier gain states for an amplifier in a predefined order during initial acquisition in a time division duplex (TDD) system. Means 604, in one example may be implemented by one or more receiver chains (e.g., 303) in conjunction with a unit or module to direct setting of the particular gain states (e.g., searcher 310). Apparatus 602 also include a means for communication 606 between other means in the apparatus, and could be implemented by a communication bus or some other equivalent means for communicative coupling.

Apparatus 602 also includes means 608 for determining signal acquisition of a received signal based on searching across the plurality of predetermined amplifier gain states as communicated by means 604. As an example, means 608 may be implemented by one or more receiver chains (e.g., 303) in conjunction with a unit or module to direct setting of the particular gain states (e.g., searcher 310) and a unit to determine initial acquisition (e.g., initial acquisition module 312), or equivalent hardware, software, or combination thereof.

A means 610 for setting amplifier gain state to the gain state of the plurality of gain states yielding signal acquisition may also be included. This means 610 could be effected by an initial acquisition module 312 in conjunction with at least one of the receive chains 303. Further, apparatus 602 may include a processor 612 and accompanying memory 614 to implement or assist any one or more of the means or functions effected by means 604, 606 or 610.

In light of the foregoing disclosure, one skilled in the art will appreciate that the present apparatus and method afford quicker resolution to the ambiguity of where to set the gain of a low noise amplifier (LNA) in a receiver operational in a TDD system. Accordingly, this results in quicker and more accurate initial acquisition in a TDD system.

Those of skill in the art will further appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

It is understood that the specific order or hierarchy of steps in the processes disclosed is merely an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill will further appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The word "exemplary" is used herein to mean "serving as an example, instance, or illustration." Any example described herein as "exemplary" is not necessarily to be construed as preferred or advantageous over other examples.

The previous description of the disclosed examples is provided to enable any person skilled in the art to make or use the present invention. Various modifications to these examples will be readily apparent to those skilled in the art, and the generic principles defined herein may be applied to other examples without departing from the spirit or scope of the invention. Thus, the present invention is not intended to be limited to the examples shown herein but is to be accorded the widest scope consistent with the principles and novel features disclosed herein.

What is claimed is:

1. A method for initial acquisition in a communication system comprising:
   running a plurality of predetermined amplifier gain states for at least one amplifier in a predefined order during initial acquisition in a time division duplex (TDD) system having first and second antennas that each duplexes downlink and uplink signals for communication with a same communication station according to a TDD format; and determining initial acquisition from received signals based on searching across the plurality of predetermined amplifier gain states run in the predefined order until a known signal is detected;

wherein, to support the initial acquisition, said running includes running a first gain state for a first signal, received via a first amplifier and the first antenna, simultaneously with running at least a second gain state for a second signal received via a second amplifier and the second antenna.

2. The method as defined in claim 1, further comprising setting a gain of the at least one amplifier to the gain state from the plurality that yields initial acquisition.

3. The method as defined in claim 1, wherein the plurality of predetermined amplifier gain states comprises a sparse subset of a larger set of one of possible or predetermined amplifier gain states.

4. The method as defined in claim 1, wherein at least a third gain state is run for the first received signal via the first amplifier and the first antenna simultaneous with at least a fourth gain state for the second received signal via the second amplifier and the second antenna when initial acquisition is not determined using the first and second gain states.

5. The method as defined in claim 4, wherein the first gain state is a highest gain state among the plurality of predetermined gain states and the second gain state is a lowest gain state among the plurality of predetermined gain states, and wherein said third gain state is between said first and second gain states and said fourth gain state is between said second and third gain states.

6. The method as defined in claim 1, wherein energy metrics respectively associated with said first and second gain states are combined to search for a known pilot to achieve initial acquisition.

7. The method as defined in claim 1, wherein running the plurality of predetermined amplifier gain states includes changing the amplifier gain states across multiple looks at the pilot during a same initial acquisition period.

8. The method as defined in claim 1, wherein the at least one amplifier is a Low Noise amplifier (LNA) in a receiver.

9. An apparatus for use in a communication device comprising:

a searcher configured to run a plurality of predetermined amplifier gain states for at least one amplifier in a predefined order during initial acquisition in a time division duplex (TDD) system having first and second antennas that each duplexes downlink and uplink signals for communication with a same communication station according to a TDD format; and an initial acquisition unit configured to determine initial acquisition from received signals based on searching across the plurality of predetermined amplifier gain states run in the predefined order until a known signal is detected;

wherein, to support the initial acquisition, the searcher is further configured to run a first gain state for a first signal, received via a first amplifier and the first antenna, simultaneously with running at least a second gain state for a second signal received via a second amplifier and the second antenna.

10. The apparatus as defined in claim 9, wherein the initial acquisition unit is further configured to set a gain of the at least one amplifier to the gain state from the plurality that yields initial acquisition.

11. The apparatus as defined in claim 9, wherein the plurality of predetermined amplifier gain states comprises a sparse subset of a larger set of one of possible or predetermined amplifier gain states.

12. The apparatus as defined in claim 9, wherein at least a third gain state is run for the first received signal via the first amplifier and the first antenna simultaneous with at least a fourth gain state for the second received signal via the second amplifier and the second antenna when initial acquisition is not determined using the first and second gain states.

13. The apparatus as defined in claim 12, wherein the first gain state is a highest gain state among the plurality of predetermined gain states and the second gain state is a lowest gain state among the plurality of predetermined gain states, and wherein said third gain state is between said first and second gain states and said fourth gain state is between said second and third gain states.

14. The apparatus as defined in claim 9, wherein energy metrics respectively associated with said first and second gain states are combined to search for a known pilot to achieve initial acquisition.

15. The apparatus as defined in claim 9, wherein the searcher is further configured to change the amplifier gain states across multiple looks at the pilot during a same initial acquisition period.

16. The apparatus as defined in claim 9, wherein the at least one amplifier is a Low Noise amplifier (LNA) in a receiver.

17. An apparatus for use in a communication device to perform initial acquisition, the apparatus comprising:

at least one processor configured to:
run a plurality of predetermined amplifier gain states for at least one amplifier in a predefined order during initial acquisition in a time division duplex (TDD) system having first and second antennas that each duplexes downlink and uplink signals for communication with a same communication station according to a TDD format; and determine initial acquisition from received signals based on searching across the plurality of predetermined amplifier gain states run in the predefined order until a known signal is detected;

wherein, to support the initial acquisition, said at least one processor runs a first gain state for a first signal, received via a first amplifier and the first antenna, simultaneously with running at least a second gain state for a second signal received via a second amplifier and the second antenna.

18. The apparatus as defined in claim 17, wherein the at least one processor is further configured to set a gain of the at least one amplifier to the gain state from the plurality that yields initial acquisition.

19. The apparatus as defined in claim 17, wherein the plurality of predetermined amplifier gain states comprises a sparse subset of a larger set of one of possible or predetermined amplifier gain states.

20. The apparatus as defined in claim 17, wherein at least a third gain state is run for the first received signal via the first amplifier and the first antenna simultaneous with at least a fourth gain state for the second received signal via the second amplifier and the second antenna when initial acquisition is not determined using the first and second gain states.

21. The apparatus as defined in claim 20, wherein the first gain state is a highest gain state among the plurality of predetermined gain states and the second gain state is a lowest gain state among the plurality of predetermined gain states, and wherein said third gain state is between said first and second gain states and said fourth gain state is between said second and third gain states.

22. The apparatus as defined in claim 17, wherein energy metrics respectively associated with said first and second gain states are combined to search for a known pilot to achieve initial acquisition.

23. The apparatus as defined in claim 17, wherein running the plurality of predetermined amplifier gain states includes changing the amplifier gain states across multiple looks at the pilot during a same initial acquisition period.

24. The apparatus as defined in claim 17, wherein the at least one amplifier is a Low Noise amplifier (LNA) in a receiver.

25. An apparatus for use in a communication device comprising:
  means for running a plurality of predetermined amplifier gain states for at least one amplifier in a predefined order during initial acquisition in a time division duplex (TDD) system having first and second antennas that each duplexes downlink and uplink signals for communication with a same communication station according to a TDD format; and
  means for determining initial acquisition from received signals based on searching across the plurality of predetermined amplifier gain states run in the predefined order until a known signal is detected;
  wherein, to support the initial acquisition, said running includes running a first gain state for a first signal, received via a first amplifier and the first antenna, simultaneously with running at least a second gain state for a second signal received via a second amplifier and the second antenna.

26. The apparatus as defined in claim 25, further comprising means for setting a gain of the at least one amplifier to the gain state from the plurality that yields initial acquisition.

27. The apparatus as defined in claim 25, wherein the plurality of predetermined amplifier gain states comprises a sparse subset of a larger set of one of possible or predetermined amplifier gain states.

28. The apparatus as defined in claim 25, wherein at least a third gain state is run for the first received signal via the first amplifier and the first antenna simultaneous with at least a fourth gain state for the second received signal via the second amplifier and the second antenna when initial acquisition is not determined using the first and second gain states.

29. The apparatus as defined in claim 28, wherein the first gain state is a highest gain state among the plurality of predetermined gain states and the second gain state is a lowest gain state among the plurality of predetermined gain states, and wherein said third gain state is between said first and second gain states and said fourth gain state is between said second and third gain states.

30. The apparatus as defined in claim 25, wherein energy metrics respectively associated with said first and second gain states are combined to search for a known pilot to achieve initial acquisition.

31. The apparatus as defined in claim 25, wherein the means for running at least one of the plurality of amplifier gain states in configured to change the amplifier gain states across multiple looks at the pilot during a same initial acquisition period.

32. The apparatus as defined in claim 25, wherein the at least one amplifier is a Low Noise amplifier (LNA) in a receiver.

33. A computer program product, comprising:
  a non-transitory computer-readable medium comprising:
    code for causing a computer to run a plurality of predetermined amplifier gain states for at least one amplifier in a predefined order during initial acquisition in a time division duplex (TDD) system having first and second antennas that each duplexes downlink and uplink signals for communication with a same communication station according to a TDD format; and
    code for causing a computer to determine initial acquisition from received signals based on searching across the plurality of predetermined amplifier gain states run in the predefined order until a known signal is detected;
  wherein, to support the initial acquisition, a first gain state is run for a first signal, received via a first amplifier and the first antenna, simultaneously with running at least a second gain state for a second signal received via a second amplifier and the second antenna.

34. The computer program product as defined in claim 33, the non-transitory computer-readable medium further comprising:
  code for causing a computer to set a gain of the at least one amplifier to the gain state from the plurality that yields initial acquisition.

35. The computer program product as defined in claim 33, wherein the plurality of predetermined amplifier gain states comprises a sparse subset of a larger set of one of possible or predetermined amplifier gain states.

36. The computer program product as defined in claim 33, wherein at least a third gain state is run for the first received signal via the first amplifier and the first antenna simultaneous with at least a fourth gain state for the second received signal via the second amplifier and the second antenna when initial acquisition is not determined using the first and second gain states.

37. The computer program product as defined in claim 36, wherein the first gain state is a highest gain state among the plurality of predetermined gain states and the second gain state is a lowest gain state among the plurality of predetermined gain states, and wherein said third gain state is between said first and second gain states and said fourth gain state is between said second and third gain states.

38. The computer program product as defined in claim 3, wherein energy metrics respectively associated with said first and second gain states are combined to search for a known pilot to achieve initial acquisition.

39. The computer program product as defined in claim 33, the non-transitory computer-readable medium further comprising:
  code for causing a computer to change the amplifier gain states across multiple looks at the pilot during a same initial acquisition period.

40. The computer program product as defined in claim 33, wherein the at least one amplifier is a Low Noise amplifier (LNA) in a receiver.

* * * * *